United States Patent
Powell, III et al.

(10) Patent No.: US 10,615,783 B2
(45) Date of Patent: Apr. 7, 2020

(54) RQL D FLIP-FLOPS

(71) Applicants: Jack R. Powell, III, Los Angeles, CA (US); Alexander Louis Braun, Baltimore, MD (US)

(72) Inventors: Jack R. Powell, III, Los Angeles, CA (US); Alexander Louis Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/051,102

(22) Filed: Jul. 31, 2018

(65) Prior Publication Data

US 2020/0044632 A1 Feb. 6, 2020

(51) Int. Cl.
*H03K 3/38* (2006.01)
*H03K 19/20* (2006.01)
(Continued)

(52) U.S. Cl.
CPC ............... *H03K 3/38* (2013.01); *G11C 11/44* (2013.01); *H03K 19/195* (2013.01); *H03K 19/20* (2013.01)

(58) Field of Classification Search
CPC ........ H03K 3/38; H03K 19/195; H03K 19/20; G11C 11/44
(Continued)

(56) References Cited

U.S. PATENT DOCUMENTS 3,094,685 A 6/1963 Crowe
4,360,898 A 11/1982 Faris
(Continued)

FOREIGN PATENT DOCUMENTS

CN 101626233 A 1/2010
CN 101626234 A 1/2010
(Continued)

OTHER PUBLICATIONS

International Written Opinion and Search Report corresponding to International Application No. PCT/US2018/056310 dated Jan. 22, 2019.
(Continued)

*Primary Examiner* — Ryan Jager
(74) *Attorney, Agent, or Firm* — Tarolli, Sundheim, Covell & Tummino LLP

(57) ABSTRACT

A reciprocal quantum logic (RQL) phase-mode D flip-flop accepts a data input and a logical clock input. A D flip-flop with an enable input further accepts enable input and further requires that the enable be asserted high to allow the data input to change the output on the logical clock pulse. The flip-flop includes a storage loop and a comparator, each of which includes Josephson junctions (JJs). The storage loop stores the data input, provided as a positive or negative single flux quantum (SFQ) pulse, is stored in the storage loop as positive or negative state, respectively, effectively biasing a JJ shared between the storage loop and the comparator. The data input is captured to the output upon clocking (or enabled clocking), when a clock pulse causes the shared JJ to preferentially trigger over an escape JJ in the comparator, the shared JJ having been biased by storage loop current.

20 Claims, 5 Drawing Sheets

(51) Int. Cl.
*G11C 11/44* (2006.01)
*H03K 19/195* (2006.01)

(58) Field of Classification Search
USPC .......................................................... 327/186
See application file for complete search history.

(56) References Cited

U.S. PATENT DOCUMENTS

| | | | |
|---|---|---|---|
| 4,956,642 A | 9/1990 | Harada | |
| 5,233,243 A | 8/1993 | Murphy et al. | |
| 5,250,859 A | 10/1993 | Kaplinsky | |
| 5,323,344 A | 6/1994 | Katayama et al. | |
| 6,310,488 B1 | 10/2001 | Hasegawa et al. | |
| 6,608,518 B2 | 8/2003 | Furuta et al. | |
| 6,734,699 B1 | 5/2004 | Herr et al. | |
| 6,756,925 B1 | 6/2004 | Leung et al. | |
| 6,781,435 B1* | 8/2004 | Gupta | H03K 19/1954 327/403 |
| 7,129,869 B2 | 10/2006 | Furuta et al. | |
| 7,227,480 B2 | 6/2007 | Furuta et al. | |
| 7,724,020 B2 | 5/2010 | Herr | |
| 7,786,748 B1 | 8/2010 | Herr | |
| 7,786,786 B2* | 8/2010 | Kirichenko | G06F 1/04 327/241 |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |
| 7,977,964 B2 | 7/2011 | Herr | |
| 8,138,784 B2 | 3/2012 | Przybysz et al. | |
| 8,489,163 B2 | 7/2013 | Herr et al. | |
| 8,571,614 B1 | 10/2013 | Mukhanov et al. | |
| 8,611,974 B2 | 12/2013 | Maibaum et al. | |
| 9,455,707 B2* | 9/2016 | Herr | H03K 3/38 |
| 9,473,124 B1* | 10/2016 | Mukhanov | H01L 27/18 |
| 9,543,959 B1* | 1/2017 | Carmean | H03K 19/195 |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |
| 9,812,192 B1 | 11/2017 | Burnett et al. | |
| 9,876,505 B1 | 1/2018 | Dai et al. | |
| 9,887,700 B2 | 2/2018 | Carmean et al. | |
| 9,905,900 B2 | 2/2018 | Herr et al. | |
| 9,917,580 B2 | 3/2018 | Naaman | |
| 9,972,380 B2 | 5/2018 | Ambrose | |
| 10,158,348 B1* | 12/2018 | Braun | H01L 39/045 |
| 10,158,363 B1* | 12/2018 | Braun | H03K 19/1954 |
| 10,171,087 B1* | 1/2019 | Braun | H03K 19/1954 |
| 2003/0011398 A1 | 1/2003 | Herr | |
| 2003/0016069 A1* | 1/2003 | Furuta | B82Y 10/00 327/367 |
| 2003/0055513 A1 | 3/2003 | Raussendorf et al. | |
| 2004/0022332 A1* | 2/2004 | Gupta | H04B 1/0003 375/343 |
| 2006/0290553 A1 | 12/2006 | Furuta et al. | |
| 2007/0077906 A1 | 4/2007 | Kirichenko et al. | |
| 2008/0186064 A1* | 8/2008 | Kirichenko | H03K 23/763 327/117 |
| 2008/0231353 A1* | 9/2008 | Filippov | H03K 5/13 327/551 |
| 2009/0002014 A1* | 1/2009 | Gupta | H03F 19/00 326/3 |
| 2009/0153180 A1 | 6/2009 | Herr | |
| 2009/0153381 A1* | 6/2009 | Kirichenko | H03M 3/408 341/143 |
| 2009/0289638 A1 | 11/2009 | Farinelli et al. | |
| 2009/0319757 A1 | 12/2009 | Berkley | |
| 2010/0033206 A1 | 2/2010 | Herr et al. | |
| 2011/0133770 A1 | 6/2011 | Przybysz et al. | |
| 2011/0267878 A1 | 11/2011 | Herr et al. | |
| 2012/0184445 A1 | 7/2012 | Mukhanov et al. | |
| 2013/0040818 A1* | 2/2013 | Herr | H03K 3/38 505/190 |
| 2014/0223224 A1 | 8/2014 | Berkley | |
| 2015/0094207 A1 | 4/2015 | Herr et al. | |
| 2015/0254571 A1* | 9/2015 | Miller | H01L 39/223 326/3 |
| 2016/0034609 A1 | 2/2016 | Herr et al. | |
| 2016/0125102 A1* | 5/2016 | Shauck | G06F 17/505 716/103 |
| 2016/0164505 A1 | 6/2016 | Naaman et al. | |
| 2017/0359072 A1 | 12/2017 | Hamilton et al. | |
| 2019/0149139 A1* | 5/2019 | Braun | H03K 3/38 |

FOREIGN PATENT DOCUMENTS

| | | |
|---|---|---|
| JP | S58135141 A | 8/1983 |
| JP | S60163487 A | 8/1985 |
| JP | H08148989 A | 6/1996 |
| JP | 2006165812 A | 6/2006 |
| JP | 2012064622 A | 3/2012 |
| JP | 2013529380 A | 7/2013 |
| WO | 2008089067 | 7/2008 |
| WO | 2016007136 A1 | 1/2016 |
| WO | 2018075106 A1 | 4/2018 |

OTHER PUBLICATIONS

International Written Opinion and Search Report corresponding to International Application No. PCT/US2018/056316 dated Jan. 25, 2019.

International Written Opinion and Search Report corresponding to International Application No. US/PCT2018/056305 dated Jan. 30, 2019.

Narendran, S. et al.: "Quantum computation based on Reciprocal Quantum logic", 2017 International Conference on Nextgen Electronic Technologies; Silicon to Software (ICNETS2), IEEE, Mar. 23, 2017 (Mar. 23, 2017), pp. 34-37. Retrieved on Oct. 13, 2017. p. 25, right hand column, paragraph 1; figures 6,7.

Kotani S. et al.: "Ultrahigh-speed logic gate family with Nb/A1-A10 x / Nb Josephson junctions", IEEE Transactions on Election Devices, vol. 33, No. 3, Mar. 1, 1986 (Mar. 1, 1986), pp. 379-384.

European Examination Report corresponding to European Patent Application No. 14 830 748.1 dated Mar. 15, 2019.

Rylyakov, A.: http://www.physics.sunysb.edu/Physics/RSFQ/Lib/AR/dff.html.

Korean Office Action Corresponding to KR Application No. 10-2017-7021776 dated Mar. 18, 2019.

ntemational Search Report for International Application No. PCT/US2018056293 dated Apr. 2, 2019.

Examination Report for Australian Patent Application No. 2018229427 dated Jun. 5, 2019.

International Search Report for PCT/US2019/015233 dated Apr. 25, 2019.

Maezawa M et al: "Pulse-driven dual-rail logic gate family based on rapid single-flux-quantum (RSFQ) devices for asynchronous circuits", Advanced Research in Asynchronous Circuits and Systems, 1996. Proceedings., Second International Symposium on Fukushima, Japan 18-21 Mar. 1, Los Alamitos, CA, USA, IEE Comput. Soc, US, Mar. 18, 1996, pp. 134-142, XP010159627, DIO:10.1109/SYNC.1996.494445 ISBN: 978-0-8186-7298-9 the whole document.

International Search Report for PCT/US2019/015228 dated Apr. 25, 2019.

Examination Report for Australian Application No. 2017237713 dated Apr. 26, 2019.

Non Final Office Action for U.S. Appl. No. 16/051,058 dated Jun. 3, 2019.

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

Canadian Office Action for Application No. 3,017,892 dated Jul. 23, 2019.

Jian Li, et al., "Dynamical Autler-Townes control of a phase qubit", Scientific Reports, vol. 2, Dec. 11, 2012, XP055268241, DOI: 10.1038/srep00654 *p. 1-p. 6, right-hand column, paragraph 2*.

(56) References Cited

OTHER PUBLICATIONS

Jerger M, et al., "Frequecy division multiplexing readout and simultaneous manipulation of an array of flux quibts", Applied Physics Letters, AIP Publicsing LLC, US, vol. 101, No. 4, Jul. 23, 2012, pp. 42604-42604, XP012164086, ISSN: 0003-6951, DOI: 10.1063/1.4739454 [retrieved on Jul. 27, 2012] *pp. 042604-1-pp. 042604-3*.

Jian Le, et al, "Operation of a phase qubit as a quantum switch", arxiv.org, Cornell University Library, 201 Olin Library Cornell University Ithaca, NY 14853, Mar. 14, 2011, SP080543914, DOI: 10.1038/SREP00645 *pae 1-p. 3, right-hand column, paragraph 3*.

Dicarlo L, et al., "Demonstration of Two-Qubit Algorithms with a Superconducting Quantum Porcessor", arxiv.org, Cornell. University Library, 201 Olin Library Cornell University Ithaca, NY 14853, Mar. 11, 2009, XP080314862, DOI: 10.1038/NATURE08121 *the whole document*.

A. Laucht, et al., "electrically controlling single-spin qubits in a continuous microwave field", Science, vol. 1, No. 3 Apr. 10, 2015, pp. e150002-e1500022, XP055267170, US ISSN: 0036-8075, DOI: 10.14126/sciadv.1500022 *the whole document*.

Japanese Office Action for Application No. 2018-549958 dated Oct. 8, 2019.

Australian Examination Report for Application No. 2017345039 dated Oct. 9, 2019.

International Search Report for International Application No. PCT/US2019/040372 dated Dec. 5, 2019.

European Search Report for Application No. EP 19 18 7630 dated Oct. 4, 2019.

Invitation to Pay Additional Fees for Application No. PCT/US2019/040297 dated Nov. 15, 2019.

Okabe, et al., "Boolean Single Flux Quantum Circuits", IEICE Transactions on Electronics, Institute of Electronics, Tokyo, JP, vol. E84-C, No. 1, Jan. 1, 2001, pp. 9-14, XP001003211, ISSN: 0916-8524, Sections 3.2 and 3.4; figures 5, 11.

Grajcar et al, "Direct Josephson coupling between superconducting flux qubits", arxiv.org, Cornell University Library, 201 Olin Library Cornell University Ithaca, NY 14853, Jan. 5, 2005, XP080187009, DOI: 10.1103/PHYSERVB.72.020503, figure 5.

International Search Report for PCT/US2019/014803 dated Jun. 6, 2019.

International Search Report for PCT/US2019/015229 dated Jun. 18, 2019.

Bacon et al., "Adiabatic Gate Teleportation", arxiv.org, Cornell University Library, 201 Olin Library Cornell University Ithaca, Ny 14853 (May 6, 2009), doi: 10.1103/PHYSERVLETT.103.120504, Claims 1-20.

Australian Examination Report for Application No. 2017345039 dated Jul. 8, 2019.

European Office Action for Application No. 17 706 655.2-1203 dated Jul. 3, 2019.

\* cited by examiner

RQL D FLIP-FLOPS

TECHNICAL FIELD

The present invention relates generally to quantum and classical digital superconducting circuits, and specifically to reciprocal quantum logic (RQL) D flip-flops.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

A flip-flop is a bistable multivibrator, a two-stable-state circuit that can therefore be used to store state information and to change state by signals applied to one or more control inputs. In modern computing and communications electronics, flip-flops are the basic storage element in sequential logic. A conventional D flip-flop, e.g., one implemented in CMOS, has two binary inputs, a data input D and a clock input, and at least one output, Q. The D flip-flop captures the value of the D input at a definite portion of an input clock cycle, e.g., a rising edge or a falling edge, known as the capture time. That captured value becomes the Q output. The output Q does not change except at the capture time (or some small propagation delay thereafter). In practical implementations it is required that a data input D be stable for some setup time prior to the capture time and for some hold time after the capture time for the input to be reliably captured and propagated to the output.

Phase-mode logic allows digital values to be encoded as superconducting phases of one or more JJs. For example, a logical "1" may be encoded as a high phase and a logical "0" may be encoded as a low phase. For example, the phases may be encoded as being zero (meaning, e.g., logical "0") or $2\pi$ (meaning, e.g., logical "1"). These values persist across RQL AC clock cycles because there is no requirement for a reciprocal pulse to reset the JJ phase.

SUMMARY

One example includes a reciprocal quantum logic (RQL) phase-mode flip-flop made of a storage loop, a comparator, and an output amplifying Josephson transmission line (JTL) that all share a Josephson junction. The storage loop is configured to receive a data input signal on a data input line as a positive or a negative single flux quantum (SFQ) pulse and store the data input signal in the storage loop. The comparator is configured to compare a logical clock input signal, or a signal based on the logical clock input signal, with the stored data input signal to produce a logical decision signal. The output amplifying JTL is configured to amplify the logical decision signal to generate an output signal corresponding to a logical "1" or logical "0" value representative of the data input signal at the time of the receipt of the logical clock input signal.

Another example includes a method of operating (e.g., of writing and reading a logical value to and from) a reciprocal quantum logic (RQL) flip-flop. A data input single flux quantum (SFQ) pulse that is one of either positive or negative is provided to a data input of an RQL flip-flop. A storage loop in the RQL flip-flop is set from a ground state to a state that is the one of either positive or negative. A positive SFQ pulse is provided to the enable input of the RQL flip-flop. A reciprocal SFQ pulse pair is provided to a clock input of the RQL flip-flop. An enabled clock SFQ pulse corresponding to the logical AND of the enable and clock inputs is provided. An output signal corresponding to a logical "1" or logical "0" value is transmitted out of an output of the RQL flip-flop. The storage loop is then returned to the ground state.

Yet another example includes a reciprocal quantum logic (RQL) phase-mode flip-flop with enable. The flip-flop includes a data signal input to a storage loop. The storage loop includes a data input Josephson junction between an input node and a ground node, a storage inductor between the input node and a central node, and a logical decision Josephson junction between the central node and the ground node. The flip-flop further includes a logical clock signal input and an enable signal input, both to logical AND circuitry, which is configured to provide an enabled clock signal to a comparator. The comparator includes, in addition to the logical decision Josephson junction, an enabled clock input inductor and an escape Josephson junction arranged in series between the logical AND circuitry and the central node.

DETAILED DESCRIPTION

This disclosure relates generally to quantum and classical digital superconducting circuits, and specifically to a reciprocal quantum logic (RQL) phase-mode D flip-flop that can be configured to have an enable input. The RQL phase-mode flip-flop can be implemented, for example, in a memory system (e.g., a quantum computing memory system) to store a logic state of an addressed memory cell. As an example, the inputs and the output can each be provided via a Josephson transmission line (JTL), such as in an RQL superconducting circuit.

An RQL phase-mode flip-flop can include a storage loop, a comparator, and an output amplifying JTL, each of which can include Josephson junctions (JJs). A data input, which can be provided as a positive or negative single flux quantum SFQ pulse, can be stored in the storage loop to set the storage loop in a positive or negative state, respectively, effectively biasing a Josephson junction that can be shared between the storage loop, comparator, and output amplifying JTL. By this it is meant that each of the storage loop, comparator, and output amplifying JTL comprise the same shared Josephson junction, which effectively serves a triple purpose. The data input can be captured to the output upon the receipt of a logical clock SFQ reciprocal pulse pair to the comparator, when one of the pulses in the pair can cause the shared Josephson junction to preferentially trigger over an escape Josephson junction in the comparator, owing to the shared Josephson junction having been biased by current in the storage loop. The capture of the data input to the output can be further conditioned upon timely receipt of an appropriate enable signal as an SFQ pulse, which is logically ANDed with the signal from the logical clock.

Figure 1:
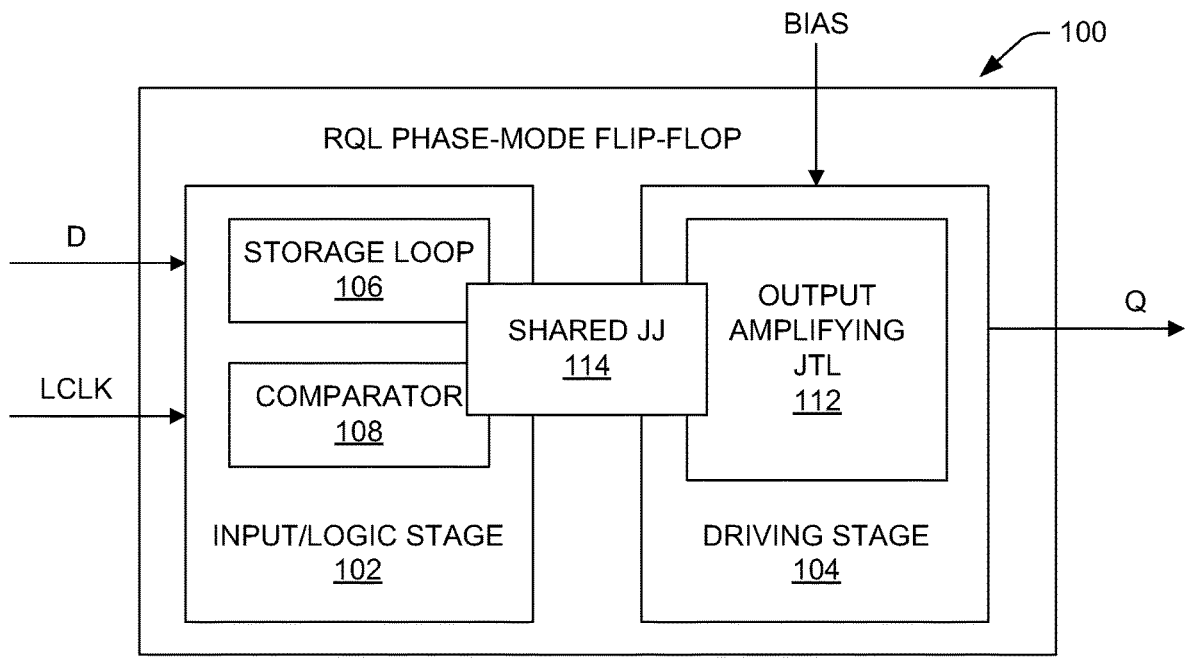
FIG. 1 is a block diagram of an example reciprocal quantum logic (RQL) phase-mode D flip-flop gate.

FIG. 1 is an example block diagram of an RQL phase-mode flip-flop 100 having data input D, logical clock input LCLK, and output Q. The flip-flop 100 is made up of an input/logic stage 102 and a driving stage 104. The input/logic stage 102 receives the inputs and logically combines them to produce the output signal, whereas the driving stage 104 in effect amplifies the output signal so that it can drive circuitry attached to the output Q of the flip-flop 100. The D and LCLK inputs and Q output follow the traditional flip-flop nomenclature, with logical clock input LCLK being the equivalent of an AC clock CLK in a CMOS flip-flop. Logical clock input LCLK can provide an SFQ signal and should not be confused with an RQL AC clock that may be used to provide reciprocal clock signals in an RQL system. Input/logic stage 102 of flip-flop 100 can include storage loop 106 configured to receive a data input signal from data input D and store it as a circulating current in a superconducting loop. Storage loop 106 can be configured to have three possible states, a ground state, a positive state, and a negative state. Input/logic stage 102 of flip-flop 100 can further include comparator 108 configured to receive a logical clock input signal from logical clock input LCLK and render a comparison between the received logical clock input signal and a stored data input signal, i.e., the state of the storage loop.

The combined function of storage loop 106 and comparator 108 can provide a logical output that is propagated through driving stage 104 as logical output Q. For example, flip-flop 100 can be configured such that if the storage loop 106 is in the positive state and a positive signal is received on the logical clock input signal LCLK, output Q is asserted to its logical "1" value; and if the storage loop 106 is in the negative state and a negative signal is received on the logical clock input signal LCLK, output Q is de-asserted to its logical "0" value. In such an example, any other combination of signals will have no effect on the logical state of output Q. Thus, for example, any received logical clock input signal LCLK, whether positive or negative, will not change the logical state of output Q when the storage loop 106 is in its ground state; a negative logical clock signal LCLK will not de-assert output Q when the storage loop 106 is in its positive state; and a positive logical clock signal LCLK will not assert output Q when the storage loop 106 is in its negative state.

For example, SFQ pulses arriving at input D can consist of alternating positive and negative SFQ pulses consistent with RQL phase-mode data encoding. Multiple pulses can be allowed to arrive between assertions of the LCLK input. These successive pulses can serve to alternate the state of the internal storage loop 106 between the ground state and the positive state if the last output at Q was a logical "0" or between the ground state and the negative state if the last output at Q was a logical "1." Only the state of the storage loop 106 when LCLK is asserted affects the output Q.

Each of storage loop 106 and comparator 108 can have at least one Josephson junction. For example, storage loop 106 can have two Josephson junctions arranged in a loop, such that the direction of a current through the loop, or the absence of such current, determine which of the three aforementioned states the storage loop is in. Also for example, comparator 108 can have two Josephson junctions that are directly connected to each other. The Josephson junctions in comparator 108 can be configured such that each time an SFQ pulse input comes in on logical clock input LCLK, only one of the two Josephson junctions in comparator 104 will trigger, and input D determines which of the two Josephson junctions in comparator 104 will trigger. Storage loop 102 and comparator 104 may also share a Josephson junction, such that one of the Josephson junctions in storage loop 102 is also one of the Josephson junctions in comparator 104.

The logic value of flip-flop 100 can be stored, for example, as the superconducting phase of a Josephson junction. For example, the logic value of flip-flop 100 can be stored as the phase of a Josephson junction that is shared between storage loop 102 and comparator 104. As an example, a 0 phase of the Josephson junction can encode a logic "0" value and a 2πc phase of the Josephson junction can encode a logic "1" value, but other combinations can work equally well.

Driving stage 104 of flip-flop 100 can include output amplifying Josephson transmission line (JTL) 112 powered by bias signal BIAS, which can be, for example, an AC and DC bias. Output amplifying JTL 112 can in effect use the power supplied by the bias signal to amplify the output of the input/logic stage 102, i.e., the logical decision associated with the flip-flop 100, to provide the output signal at output Q. Storage loop 106, comparator 108, and output amplifying JTL 112 all share a Josephson junction 114.

Figure 2:
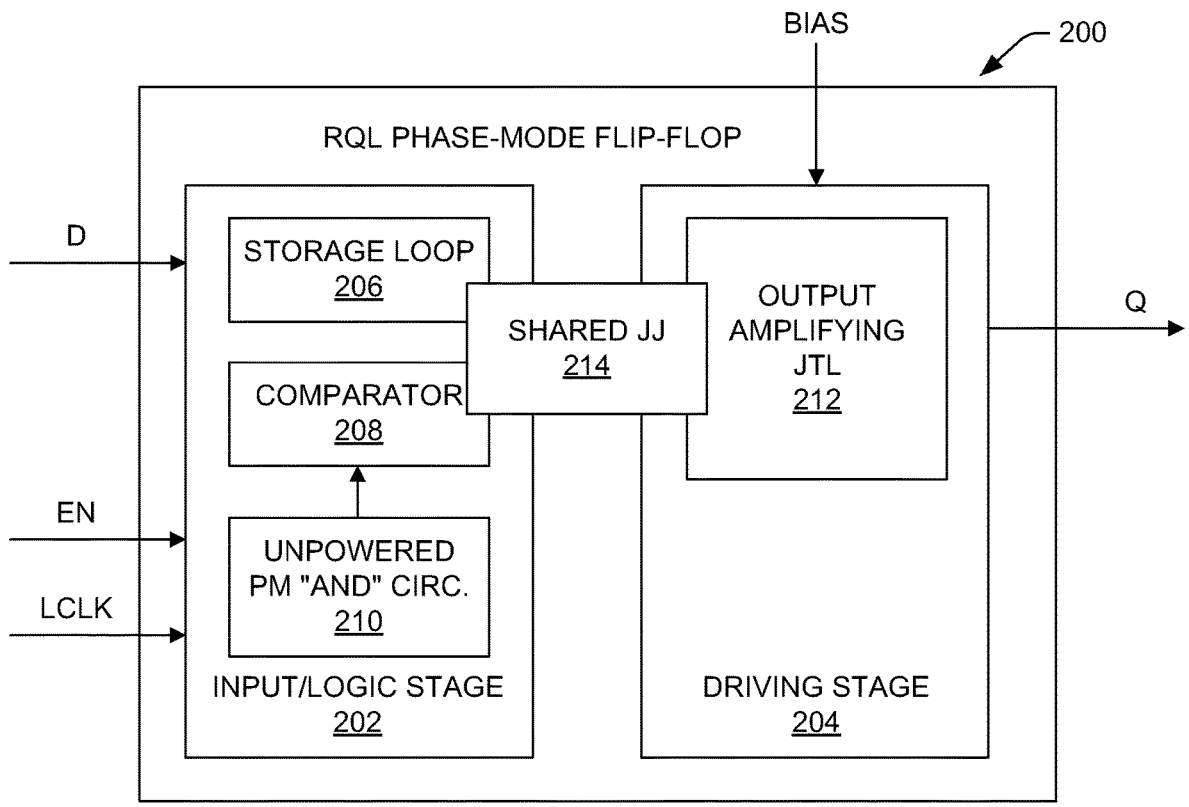
FIG. 2 is a block diagram of an example RQL phase-mode D flip-flop gate with enable.

FIG. 2 is an example block diagram of an RQL phase-mode flip-flop 200 with enable. That is, in addition to having data input D and logical clock input LCLK to produce output Q, the gate 200 further has an enable input EN. Logical output Q cannot be asserted or de-asserted without the respective assertion or de-assertion of the enable input EN Like gate 100, flip-flop 200 is made up of an input/logic stage 202 and a driving stage 204, which function similarly to what has been described above, except that the logical clock signal LCLK and the enable signal EN are logically ANDed by unpowered phase-mode AND circuitry 210 included in the input/logic stage 202. Absence of an appropriate input on enable signal EN (e.g., a positive SFQ pulse) thus effectively prevents logical clock signal LCLK from getting through to "clock" the data input D to the output Q (via the driving stage 204 and its output amplifying JTL 212). As with flip-flop 100 in FIG. 1, flip-flop 200 shares a Josephson junction 214 with storage loop 206, comparator 208, and output amplifying JTL 212.

Figure 3:
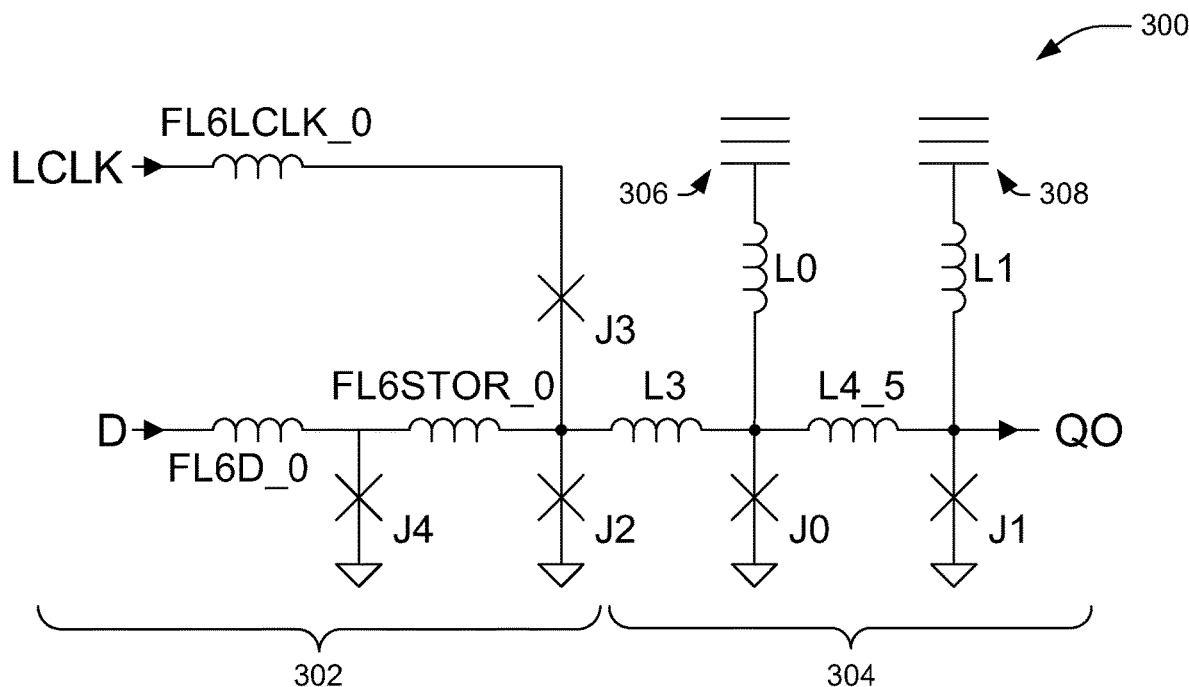
FIG. 3 is a circuit diagram of an RQL phase-mode D flip-flop gate.

FIG. 3 is an example circuit diagram illustrating a design of an RQL phase-mode D flip-flop gate 300 having an input/logic stage 302 and a driving stage 304. Flip-flop 300 can include five Josephson junctions J0, J1, J2, J3, and J4, and seven inductors FL6D_0, FL6LCLK_0, FL6STOR_0, L3, L4_5, L0, and L1. Input/logic stage 302 can receive data input D and logical clock input LCLK on input lines that are each configured to receive single flux quantum (SFQ) pulses as inputs. Input/logic stage 302 includes a storage loop formed by data input Josephson junction J4, storage inductor FL6STOR_0, and logical decision Josephson junction J2. An input signal from data input D triggers data input Josephson junction J4 and stores a superconducting current in the storage loop. The storage loop is connected, at the bottom of FIG. 3, by a ground node, which can be a ground plane of a chip. Owing to the comparatively large size of storage inductor FL6STOR_0, the current stored there will not be enough to trigger logical decision Josephson junction J2 on its own. However, the introduction of an SFQ pulse as an LCLK signal can "clock" the D input by triggering logical decision Josephson junction J2 (logical decision Josephson junction J2 having been biased by current in the storage loop) and thus to provide an SFQ pulse through driving stage inductors L3 and L4_5, successively, which finally exits gate 300 at output QO. More detailed explanation of the functioning of input/logic stage 302 may be found in U.S. patent application Ser. No. 15/810,860, herein incorporated by reference. Driving stage 304 comprises a driving Josephson transmission line (JTL) that in effect amplifies the output of input/logic section 302 so as to appropriately drive a next-stage gate or circuit to which the D flip-flop 300 may be connected at its output. The JTL is connected to AC and DC biases 306, 308 through inductors L0, L1, respectively.

In some examples comparator Josephson junctions J3 and J2 can each be configured to exhibit critical currents between 30 microamperes and 55 microamperes, e.g., between 35 microamperes and 50 microamperes. Data input Josephson junction J4 may be configured to exhibit a critical current at a larger current, e.g., between 55 microamperes and 65 microamperes, e.g., 60 microamperes. In some examples, storage inductor FL6STOR_0 may be configured to have an inductance value between 25 picohenries (pH) and 40 pH, e.g., between 30 pH and 35 pH. Storage inductor FL6STOR_0 and data input Josephson junction J4 can be configured such that the product of the inductance of storage inductor FL6STOR_0 and the critical current of data input Josephson junction J4 is between 1.4 and 2.0 mA-pH. Comparator Josephson junctions J3 and J2 can be configured to exhibit critical currents similar to each other. Comparator Josephson junctions J3 and J2 need not exhibit critical currents at exactly the same currents, but comparator Josephson junctions J3 and J2 can be close in critical current size to one another, e.g., within 10% of each other.

The storage loop composed of data input Josephson junction J4, storage inductor FL6STOR_0, and logical decision Josephson junction J2 has three possible states, a ground state where there is no current in the storage loop, a positive state where there is one single flux quantum $\Phi_0$ (e.g., $\Phi_0$=2.07 mA-pH) of current circulating in the counter-clockwise direction, and a negative state where there is one $\Phi_0$ of current circulating in the clockwise direction. Storage inductor FL6STOR_0 is sized to be large enough such that in the positive and negative states, the induced current is insufficient to trigger storage loop Josephson junctions J2 or J4 even when combined with any AC bias leaking in from output stage 304 (e.g., from DC and AC biases 306, 308). Input D is used to induce current in this storage loop. Positive pulses on input D, which can be driven nonreturn-to-zero (NRZ), induce clockwise current in the storage loop, and negative pulses on input D induce counter-clockwise current in the storage loop.

Comparator Josephson junctions J3 and J2 of flip-flop 300 form a comparator. Escape Josephson junction J3 can be configured to have a smaller critical current than logical decision Josephson junction J2. The current in the storage loop can be used to adjust the biasing of logical decision Josephson junction J2. The input of logical clock LCLK can be used to trigger the comparator and read out the state of the storage loop, ultimately to output QO. The logical clock LCLK can be driven with a return-to-zero (RZ) pulse pair.

In the ground state of the storage loop formed by data input Josephson junction J4, storage inductor FL6STOR_0, and logical decision Josephson junction J2, there is no current in the storage loop. In this state, any pulses, positive or negative, arriving from the logical clock input LCLK trigger the escape Josephson junction J3. This destroys the incoming LCLK pulse and leaves the state of both the storage loop and the output QO of flip-flop 300 unchanged. As such, any positive-negative pulse pair from LCLK has no effect when the storage loop is in the ground state. Despite the three states of the storage loop (i.e., storing one of a positive current, a negative current, or essentially no current in the storage loop), the flip-flop 300 has only two states, corresponding to binary logical values "0" and "1", as encoded by the phase of logical decision Josephson junction J2, either 0 or $2\pi$.

Each time an SFQ pulse input comes in on logical clock input LCLK, one and only one of the comparator Josephson junctions J3 or J2 will trigger, and input D determines which of comparator Josephson junctions J3 or J2 will trigger. If input D has not put any current into the storage loop, or has effectively destroyed any current from the storage loop by supplying an opposite pulse, any inputs on LCLK will trigger escape Josephson junction J3 alone, effectively rejecting such LCLK inputs, and no output is created on QO. If input D has put a current into the storage loop, thus changing the bias condition of logical decision Josephson junction J2, and because logical decision Josephson junction J2 will see current stored in the storage loop but escape Josephson junction J3 does not, logical decision Josephson junction J2 will preferentially trigger and generate an output SFQ pulse that is propagated on as output QO. In arrangement 300, when comparator Josephson junctions J3 and J2 are close to the same size, and when there is no current in the storage loop, escape Josephson junction J3 will trigger first, because it sees all of the current from input LCLK, whereas logical decision Josephson junction J2 sees only most of such current, since some of such current will leak out through the storage loop and through inductor L3 given that each branch emanating from the node connecting comparator Josephson junctions J3 and J2 together form an inductive network in parallel.

D flip-flop 300 is a "phase-mode" flip-flop inasmuch as the logic value of flip-flop 300 is stored as the superconducting phase (either 0 or $2\pi$) of logical decision Josephson junction J2, i.e., the Josephson junction that is shared between the storage loop of flip-flop 300 and the comparator of flip-flop 300. D flip-flop 300 is efficient in terms of its use of devices, requiring only three Josephson junctions and three inductors in its input/logic stage 302, apart from any devices used for race condition avoidance phasing of input signals.

Driving stage 304, which might also be termed an amplifying output stage, includes a JTL that propagates a pulse from logical decision Josephson junction J2 through inductors L3 and L4_5 to trigger output Josephson junction J1 and thus send a pulse out output QO, which assertion signal or de-assertion signal is indicative of the logical D flip-flop output given inputs D and LCLK.

Figure 4:
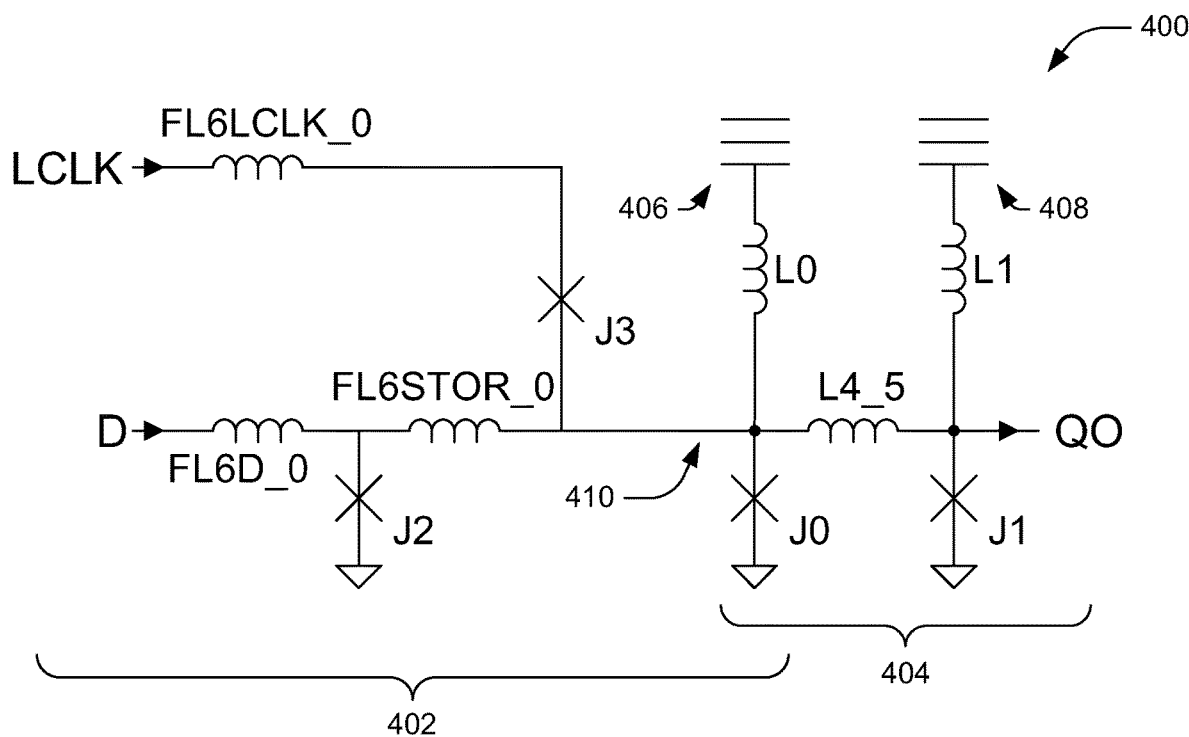
FIG. 4 is a circuit diagram of an example RQL phase-mode D flip-flop gate.

FIG. 4 shows an example D flip-flop 400, which differs from D flip-flop 300 of FIG. 3 in that instead of having separate input/logic and driving stages of the gate, as is the case in the design of FIG. 3, the logical decision Josephson junction of the input structure is combined with the first junction of the driving structure, namely, as shared Josephson junction J0 in FIG. 4. Correspondingly, to the extent that they can each be identified in gate 400, input/logic stage 402 and driving stage 404 can be considered to have some overlap with each other in the circuit, as illustrated in FIG. 4. AC and DC biases 406, 408 provide power to an output amplifying JTL formed by Josephson junctions J0 and J1 and inductors L0, L1, and L4_5. A central node 410 within the storage loop formed by data input Josephson junction J2, storage inductor FL6STOR_0, and shared Josephson junction J0 is also at the middle of the comparator formed by escape Josephson junction J3 and shared Josephson junction J0, and is also within the output amplifying JTL. A logical clock input signal is delivered through clock input inductor FL6LCLK_0.

The improvement to gate 300 represented by gate 400, enabled by the partial powering of the comparator structure in the input/logic section of the gate, lowers part count (by one Josephson junction and one inductor) for the gate and also assists in providing better operational margins for the escape Josephson junction J3 within the comparator of the input/logic structure, said comparator in gate 400 of FIG. 4 now being composed of Josephson junctions J3 and J0. D flip-flop 400 otherwise functions similarly to D flip-flop 300 as described above.

Figure 5:
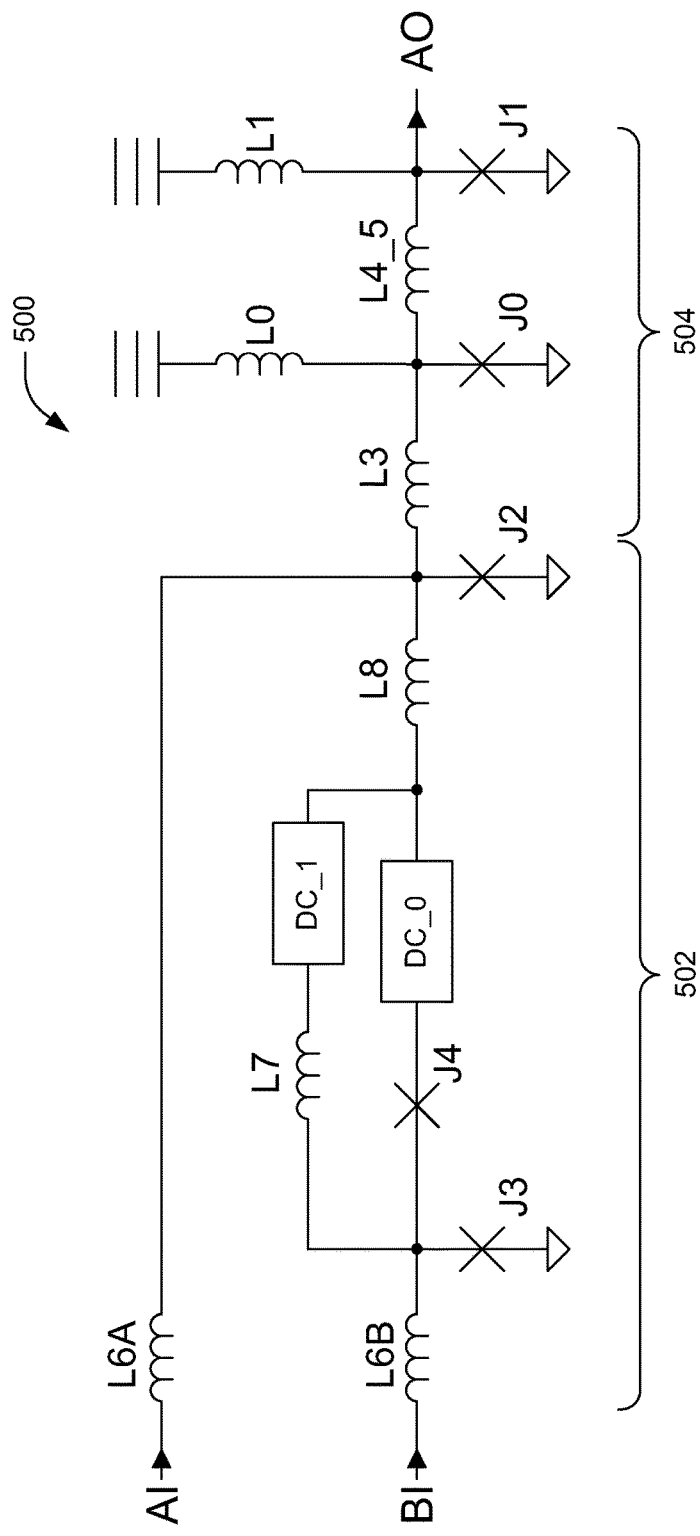
FIG. 5 is a circuit diagram of an RQL phase-mode AND-RF gate.
Figure 6:
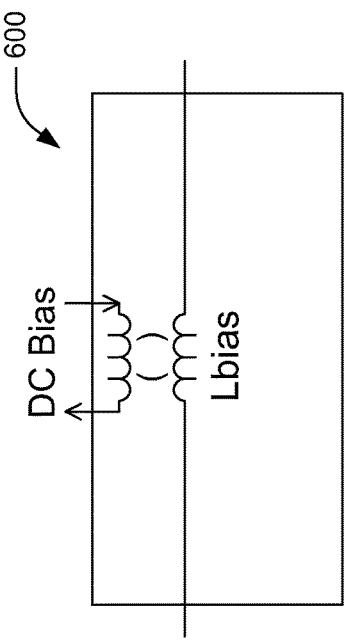
FIG. 6 is a circuit diagram of one example of a DC bias element.

FIG. 5 illustrates an AND_RF gate 500 in which an SFQ signal at output AO represents a logical AND of inputs AI and BI, which are configured to receive SFQ pulses as their inputs. AND_RF gate 500 consists of an input/logic stage 502, which can be considered an unpowered portion of the gate, and a driving stage 504, each similar in function to the corresponding stages 302, 304 in gate 300 of FIG. 3, except that input/logic stage 502 performs an AND logical function rather than the D flip-flop function. Input/logic stage 502 of AND_RF gate 500 includes a DC bias loop, which is composed of DC bias loop Josephson junction J4, DC bias loop inductor L7, and DC bias elements DC_0 and DC_1. DC bias loop Josephson junction J4 acts as a quantizing junction, and DC bias loop inductor L7 functions to mirror the parasitic inductance of DC bias loop Josephson junction J4 to balance the DC bias loop. The two DC bias elements DC_0 and DC_1 in AND_RF gate 500 can be implemented in a variety of ways; one example is shown in FIG. 6. In example DC bias element 600 of FIG. 6, a DC current is introduced to the circuit via a transformer-coupled inductor Lbias.

The DC bias loop in gate 500 in effect places, at system initialization, a clockwise circulating current into the loop formed by DC bias DC_1, DC bias DC_0, Josephson junction J4, and inductor L7, thus triggering J4. A DC bias of about ½ $\Phi_0$ worth of current is thereby placed into the storage loop formed by input Josephson junction J3, storage inductor L8, and logical decision Josephson junction J2, flowing counter-clockwise from logical decision Josephson junction J2 toward input Josephson junction J3 through storage inductor L8. This circulating current negatively biases logical decision Josephson junction J2 such that it does not trigger upon receiving a positive input SFQ pulse on input AI, as any such pulses will remain stuck in the loop formed by logical decision Josephson junction J2, input inductor L6A, and an output Josephson junction connected to input AI (not shown). Any subsequent negative SFQ pulse arriving on input AI annihilates the trapped positive SFQ pulse. Thus, until input BI has been asserted with a positive SFQ pulse, no pulses arriving from input AI are permitted to propagate through to output AO.

Still with regard to FIG. 5, a positive SFQ pulse arriving on input BI triggers input Josephson junction J3, driving a positive SFQ pulse from input Josephson junction J3 toward logical decision Josephson junction J2. Because, just prior to this point, there is about ½ $\Phi_0$ of initialization current flowing counter-clockwise in the storage loop formed by input Josephson junction J3, storage inductor L8, and logical decision Josephson junction J2, the triggering of input Josephson junction J3 introduces one $\Phi_0$ worth of current into the same storage loop, for a net of ½ $\Phi_0$ worth of current flowing clockwise in the storage loop—effectively reversing the direction of the initialization current. The DC bias now positively biases logical decision Josephson junction J2, and logical decision Josephson junction J2 can now pass a positive SFQ pulse from input AI to output AO. Doing so also sends a positive SFQ pulse from logical decision Josephson junction J2 toward input Josephson junction J3, reversing the DC bias again and making it so that logical decision Josephson junction J2 is capable of passing a subsequent negative SFQ pulse from input AI when it arrives, passing the negative SFQ pulse from input AI to output AO. A subsequent negative pulse arriving on input BI, so long as it does not arrive between a positive and a negative SFQ pulse from AI, will undo the enabling effect of the BI input branch and return the circuit 500 to the earlier state where logical decision Josephson junction J2 does not pass pulses from AI to output AO. Thus, the BI input branch acts as an enablement line to deny or permit positive or negative pulses received on input AI to propagate to output AO. Following such enablement, a negative SFQ pulse received on input BI will again disable the propagation of pulses from input AI to output AO.

Figure 7:
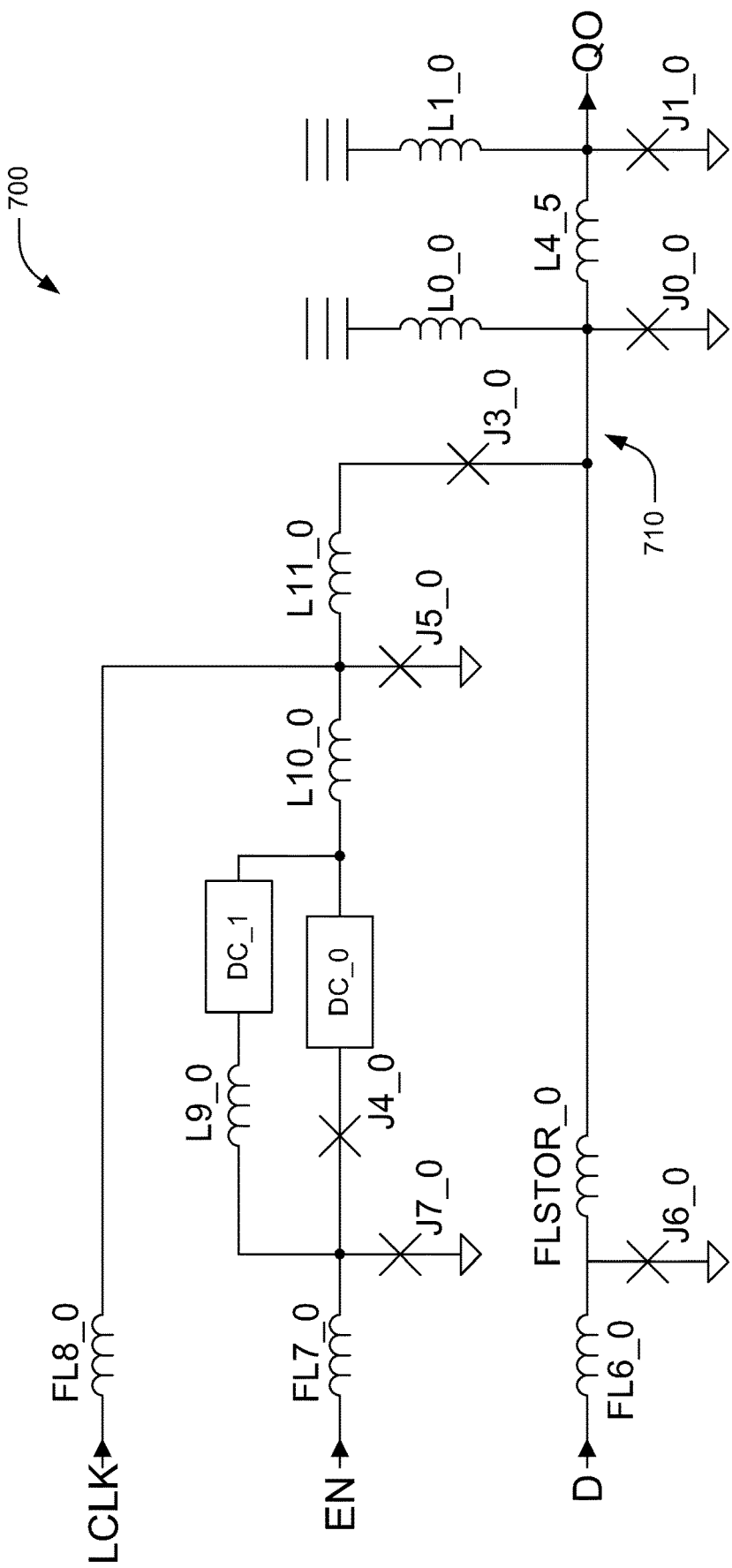
FIG. 7 is a circuit diagram of an example RQL phase-mode D flip-flop gate with enable.

FIG. 7 illustrates an example enabled D flip-flop 700 consisting of an AND_RF gate structure like the unpowered portion 502 of gate 500 in FIG. 5 combined with a non-enabled D flip-flop gate structure like that of gate 400 in FIG. 400, to achieve a singular D flip-flop 700 with enable EN. The example gate 700 contains just seven Josephson junctions, ten inductors and two external DC biases (the inductor and Josephson junction counts exclusive of whatever components may be used to provide the DC biases). A central node 710 within the storage loop formed by data input Josephson junction J6_0, storage inductor FLSTOR_0, and shared Josephson junction J0_0 is also at the middle of the comparator formed by escape Josephson junction J3_0 and shared Josephson junction J0_0, and is also within the output amplifying JTL formed by Josephson junctions J0_0 and J1_0 and inductors L0_0, L4_5, and L1_0.

The AND_RF gate structure portion of the example enabled D flip-flop gate 700 consists of inductor FL8_0, to which the LCLK signal is provided (corresponding to inductor L6A to which input AI is provided in AND_RF gate 500); inductors FL7_0, L10_0, and L9_0, Josephson junctions J7_0 and J4_0, and DC bias elements DC_1 and DC_0, to which enable input EN is provided (which corresponds to input BI in AND_RF gate 500); and Josephson junction J5_0 (corresponding to Josephson junction J2 in AND_RF gate 500). The powered portion 504 of the AND_RF gate (between inductor L3 and output AO in FIG. 5) is not included in enabled D flip-flop gate 700. Enabled D flip-flop gate 700 takes the RZ clock line LCLK and logically ANDs it with the NRZ enable line, as described above with respect to FIG. 5. Thus, an enabled clock SFQ pulse corresponding to the logical AND of the enable input EN and clock inputs LCLK is provided such that when enable input EN is asserted, positive and negative SFQ pulses introduced on logical clock input LCLK propagate through to the comparator formed by Josephson junctions J3_0 and J0_0. Enabled clock input inductor L11_0 and escape Josephson junction J3_0 of gate 700 of FIG. 7 correspond, respectively, to inductor FL6CLK_0 and escape Josephson junction J3 of gate 400 of FIG. 4.

Like non-enabled D flip-flop gate 400 of FIG. 4, enabled D flip-flop gate 700 of FIG. 7 includes a storage loop composed of Josephson junction J6_0, storage inductor FLSTOR_0, and Josephson junction J0_0. In a ground state, no current circulates in the storage loop; therefore, there is no reverse biasing of escape Josephson junction J3_0, and an enabled clock pulse triggers the escape Josephson junction such that output QO remains unchanged. At system initialization, DC biases DC_1 and DC_0 induce a clockwise current in the loop formed by these DC biases J4_0 and L9_0. This triggers Josephson junction J4_0. The net result is a DC bias of about ½ $\Phi_0$ worth of current flowing counter-clockwise from Josephson junction J5_0 toward Josephson junction J7_0. This negatively biases Josephson junction J5_0, making Josephson junction J5_0 impossible to trigger for a positive SFQ pulse coming from logical clock input LCLK. Any such pulses will be stuck in the loop formed by Josephson junction J5_0, inductor FL8_0 and an output Josephson junction of the LCK driver (not shown). The negative SFQ pulse of the LCLK signal, when it arrives, will just annihilate the positive SFQ that was trapped. As a result, the comparator in the lower latching portion of circuit 700 is never clocked.

In gate circuit 700 of FIG. 7, enable input EN in effect controls whether the DC bias applied at Josephson junction J5_0 is +½ $\Phi_0$ or −½ $\Phi_0$. At system start-up, circuit 700 defaults to −½ $\Phi_0$ bias applied to Josephson junction J5_0 and therefore does not allow clock pulses to propagate. A positive SFQ pulse at the enable input EN switches this bias to +½ $\Phi_0$ and thereby allows clock pulses to propagate from the LCLK input to the flip-flop portion of circuit 700 via inductor L11_0 and Josephson junction J3_0.

To write a logical "1" to gate 700, the D input of gate 700 is asserted high with a positive SFQ pulse, thus placing one $\Phi_0$ worth of current circulating clockwise in the gate's storage loop, i.e., the loop consisting of input Josephson junction J6_0, storage inductor FLSTOR_0, and logical decision Josephson junction J0_0. The enable input EN is asserted with a positive SFQ pulse so that the incoming clock pulse, triggering Josephson junction J7_0 and thereby driving a positive SFQ pulse from Josephson junction J7_0 towards Josephson junction J5_0. The ½ $\Phi_0$ worth of initialization current flowing counter-clockwise in the loop that includes Josephson junction J5_0, inductor L10_0, and Josephson junction J7_0 is, in effect, reversed by the about one $\Phi_0$ worth of current introduced by the positive triggering of Josephson junction J7_0. The DC bias now positively biases Josephson junction J5_0, and Josephson junction J5_0 now can pass a positive SFQ pulse from logical clock input LCLK. When it does this, it sends a positive SFQ pulse into the latch comparator portion of circuit 700, latching a logical "1" and generating a positive SFQ at output QO based on the positive SFQ pulse stored in the D-input storage loop that includes input Josephson junction J6_0, storage inductor, FLSTOR_0, and logical decision Josephson junction J0_0. It also drives an SFQ pulse towards Josephson junction J7_0, reversing the DC bias again and making it so that Josephson junction J5_0 is capable of passing a subsequent negative pulse from logical clock input LCLK when it arrives. In summary, then, a positive enablement SFQ pulse arriving on enable input EN permits a positive SFQ pulse from logical clock input LCLK to clock a positive SFQ pulse circulating in the D-input storage loop to propagate to the output QO as a positively asserted SFQ pulse representing a logical "1."

To write a logical "0" to gate 700, the D input is asserted low with a negative SFQ pulse, thus placing one $\Phi_0$ worth of current circulating counter-clockwise in the gate's storage loop, i.e., the loop consisting of input Josephson junction J6_0, storage inductor FLSTOR_0, and logical decision Josephson junction J0_0. When the enabled logical clock pulse comes in through enabled clock input inductor L11_0, as described above, this negative pulse is sent to the lower latch comparator portion of gate 700, thus latching a logical "0," i.e., generating a negative SFQ at output QO based on the negative SFQ pulse stored in the D-input storage loop that includes input Josephson junction J6_0, storage inductor, FLSTOR_0, and logical decision Josephson junction J0_0. In summary, then, a positive enablement SFQ pulse arriving on enable input EN permits a negative SFQ pulse from logical clock input LCLK to clock a negative SFQ pulse circulating in the D-input storage loop to propagate to the output QO as a negatively asserted SFQ pulse representing a logical "0."

A subsequent negative pulse at enable input EN, so long as it doesn't come between the positive and negative pulses from logical clock input LCLK, will undo the enabling effect and return circuit 700 to the state wherein Josephson junction J5_0 will not pass logical clock input SFQ pulses from LCLK. Thus, at a high level, when enable input EN is at a logic "high," the latch 700 can be clocked, and when enable input EN is at a logic "low," clock pulses from input LCLK are prevented from reaching the latch 700.

The data signal D and enable signal EN should be supplied with the necessary setup and hold times. Specifically, these signals should be placed on the phase boundary before the clock pulse LCLK. Phasing JTLs can provide the appropriate phase boundaries to properly drive the D flip-flop 700, as described in U.S. patent application Ser. No. 15/810,860.

The design of gate 700 not only provides a novel enabled phase-mode RQL D flip-flop circuit, it also provides circuit component economy over a combination of separate gates 300 and 500 both in that it eliminates driving stage 504 of circuit 500 and in that it eliminates junction J2 and inductor L4 from the base D flip-flop structure 300, enabled by the partial powering of the comparator structure in the input/logic section of the gate. The gates described herein greatly reduce the cost of producing RQL chips by increasing the density of logic, thereby reducing die size and leading directly to fabrication cost savings.

Figure 8:
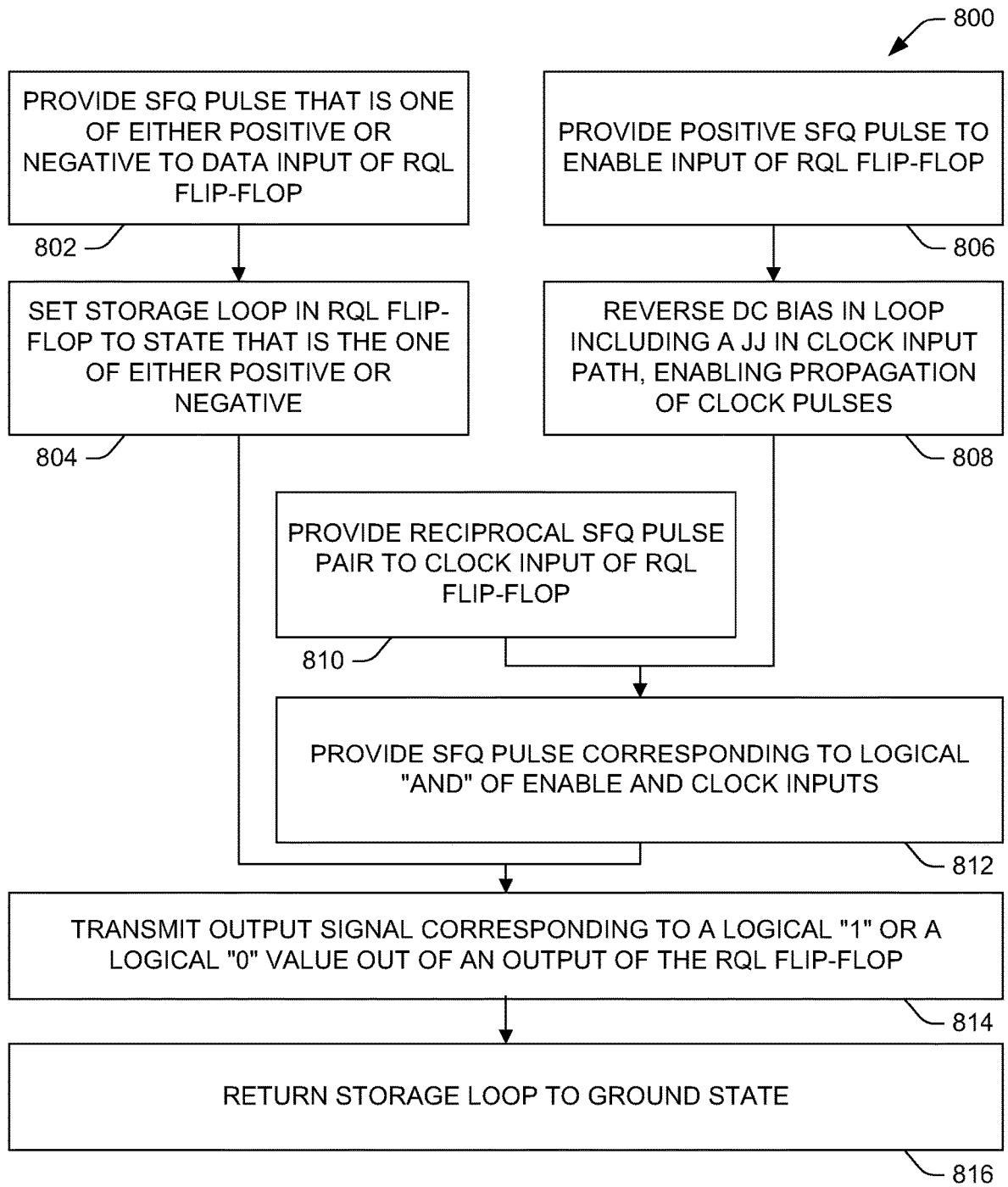
FIG. 8 is a flow diagram of an example method of operating (e.g., writing and reading values to and from) an RQL phase-mode D flip-flop with enable.

FIG. 8 is a flow chart illustrating a method 800 of operating (e.g., writing and reading a logical value to and from) an RQL phase-mode D flip-flop. A data input SFQ pulse that is one of either positive or negative is provided 802 to a data input of an RQL flip-flop. Based on the provision of the data input SFQ pulse, a data input storage loop in the RQL flipflop is set 804 from a ground state to a state that is the one of either positive or negative (i.e., corresponding to the provided pulse). This data input storage loop can correspond, for example, to the loop comprising data input Josephson junction J6_0, data input storage inductor FLSTOR_0, and logical decision Josephson junction J0_0 in circuit 700 of FIG. 7.

A positive SFQ pulse is provided 806 to an enable input of the RQL flip-flop, reversing 808 a DC bias in an enable input loop that includes a Josephson junction in a clock input path, enabling propagation of clock pulses from a clock input of the RQL flip-flop. The enable input loop can correspond, for example, to the loop including enable input Josephson junction J7_0, inductor L10_0, and Josephson junction J5_0 in circuit 700 of FIG. 7. The "Josephson junction in the clock input path" can correspond, for example, to Josephson junction J5_0 in circuit 700 of FIG. 7.

A reciprocal SFQ pulse pair (i.e., an RZ input) is provided 810 to the clock input of the RQL flip-flop. An SFQ pulse corresponding to the logical AND of the enable and clock inputs is thereby provided 812, e.g., to the data input storage loop. Based on the resultant enabled clock signal, an output signal corresponding to a logical "1" or logical "0" value is transmitted 814 out of an output of the RQL flip-flop, e.g., by driving an output SFQ pulse that is the one of either positive or negative out of an output of the RQL flip-flop. The data input storage loop can then be returned 816 to a ground state. If the "one of either positive or negative" for each action is positive, a logical "1" value can be said to have been written and read, whereas if the "one of either positive or negative" is negative, a logical "0" value can be said to have been written and read. Because the designation of "1" and "0" as assigned to positive or negative states may be arbitrary in the context of the logic of the larger system in which the flip-flop is implemented, the logical values may be inversed in some examples, e.g., negative input and output pulses might encode logical "1" whereas positive input and output pulses might encode logical "0." The output can be based on the data input, the enable input, and the clock input.

In method 800, as an example, the setting of the data input storage loop state can include triggering a data input Josephson junction (e.g., Josephson junction J6_0 illustrated in FIG. 7) in the data input storage loop to establish a current in the data input storage loop, the circulation direction of current in the data input storage loop corresponding to whether the data input SQF pulse is positive or negative. The current in the data input storage loop established by the setting the data input storage loop state can be insufficient to trigger a second Josephson junction (e.g., Josephson junction J0_0 in FIG. 7) in the data input storage loop that is shared by the data input storage loop, a comparator, and an output amplifying JTL.

In method 800, as an example, when the data input SFQ pulse is positive, the reciprocal SFQ pulse pair provided to the clock input can be made up of a positive pulse and a negative pulse to the clock input, which can be provided in either order. Then, one enabled clock SFQ pulse corresponding to the positive pulse to the clock input can trigger a logical decision Josephson junction (e.g., Josephson junction J0_0 in FIG. 7) in the data input storage loop, thereby asserting the output. Another enabled clock SFQ pulse corresponding to the negative pulse to the clock input can trigger an escape Josephson junction (e.g., Josephson junction J3_0 in FIG. 7) and having a common node with the logical decision Josephson junction, the triggering of the escape Josephson junction not affecting the state of the data input storage loop. The triggering of the logical decision Josephson junction can return the data input storage loop to the ground state by canceling the current in the data input storage loop and can cancel a current through the escape Josephson junction created by the providing the enabled clock SFQ pulse corresponding to the positive pulse to the clock input.

In method 800, as another example, when the data input SFQ pulse is negative, the reciprocal SFQ pulse pair provided to the clock input can be made up of a positive pulse and a negative pulse to the clock input, which can be provided in either order. Then, one enabled clock SFQ pulse corresponding to the positive pulse to the clock input can trigger an escape Josephson junction (e.g., Josephson junction J3_0 in FIG. 7) having a common node with a logical decision Josephson junction (e.g., Josephson junction J0_0 in FIG. 7) in the data input storage loop, the triggering of the escape Josephson junction not affecting the state of the data input storage loop. Another enabled clock SFQ pulse corresponding to the negative pulse to the clock input can trigger the logical decision Josephson junction, thereby de-asserting the output. The triggering of the logical decision Josephson junction can return the data input storage loop to the ground state by canceling the current in the data input storage loop and can cancel a current through the escape Josephson junction created by providing the enabled clock SFQ pulse corresponding to the negative pulse to the clock input.

In method 800, as yet another example, the providing an enabled clock SFQ pulse corresponding to the logical AND of the enable and clock inputs can include reducing an enable input current corresponding to the SFQ pulse provided to the enable input to about ½ $\Phi_0$. For example, the reducing the enable input current can be done using a DC bias loop comprising a Josephson junction (e.g., Josephson junction J4_0 in FIG. 7), an inductor (e.g., inductor L9_0 in FIG. 7), and first and second DC bias elements (e.g., DC_0 and DC_1 in FIG. 7).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) phase-mode flip-flop comprising:
   a storage loop configured to receive a data input signal on a data input line as a positive or a negative single flux quantum (SFQ) pulse and store the data input signal in the storage loop;
   a comparator configured to compare a received logical clock input signal, or a signal based on the received logical clock input signal, with the stored data input signal to produce a logical decision signal; and
   an output amplifying Josephson transmission line (JTL) configured to amplify the logical decision signal to generate an output signal corresponding to a logical "1" or logical "0" value representative of the data input signal at a time of the receipt of the logical clock input signal,
   wherein the storage loop, the comparator, and the output amplifying JTL of the RQL phase-mode flip-flop all share a Josephson junction.

2. The flip-flop of claim 1, wherein the output signal is a negative or positive SFQ pulse corresponding to a 0 or $2\pi$ quantum phase of the shared Josephson junction.

3. The flip-flop of claim 1, wherein the storage loop comprises a data input Josephson junction, the shared Josephson junction, and a storage inductor arranged in the storage loop.

4. The flip-flop of claim 1, wherein the comparator comprises an escape Josephson junction and the shared Josephson junction both sized to have about equal critical currents.

5. The flip-flop of claim 1, wherein the comparator comprises a clock input inductor and an escape Josephson junction arranged in series between the logical clock input line and a central node to which the shared Josephson junction is connected, wherein the shared Josephson junction is arranged between the central node and a ground node, and wherein the escape Josephson junction is sized such that it preferentially triggers before the shared Josephson junction in the absence of additional biasing of the shared Josephson junction.

6. The flip-flop of claim 5, wherein the comparator is configured such that the comparison between the received logical clock input signal, or the signal based on the received logical clock input signal, and the stored data input signal comprises one and only one of the escape Josephson junction and the shared Josephson junction triggering in response to an SFQ pulse received as the logical clock input signal.

7. The flip-flop of claim 6, wherein the comparator is configured such that that the comparison between the received logical clock input signal, or the signal based on the received logical clock input signal, and the stored data input signal comprises the shared Josephson junction preferentially triggering to generate the logical decision signal based on a positive or negative bias condition on the shared Josephson junction resulting from a current in the storage loop corresponding to the data input signal.

8. The flip-flop of claim 1, further comprising unpowered phase-mode AND circuitry configured to AND the logical clock input signal with an enable input signal received on an enable input line, and wherein the logical value of the output signal is representative of the data input signal at the time of the receipt of the logical clock input signal based on the flip-flop being enabled by the enable input signal.

9. The flip-flop of claim 8, wherein the unpowered phase-mode AND circuitry comprises a DC bias loop comprising a Josephson junction, an inductor, and first and second DC bias elements, wherein the DC bias loop is configured to reduce by about half one $\Phi_0$ worth of current corresponding to the enable input signal supplied to the enable input line.

10. A method of operating a reciprocal quantum logic (RQL) flip-flop, the method comprising:
providing a data input single flux quantum (SFQ) pulse that is one of either positive or negative to a data input of an RQL flip-flop;
setting a data input storage loop in the RQL flip-flop from a ground state to a state that is the one of either positive or negative;
providing a positive SFQ pulse to an enable input of the RQL flip-flop;
providing a reciprocal SFQ pulse pair to a clock input of the RQL flip-flop;
providing an enabled clock SFQ pulse corresponding to the logical AND of the enable and clock inputs to the data input storage loop;
transmitting an output signal corresponding to a logical "1" value, based on the state of the data input storage loop being positive, or a logical "0" value, based on the state of the data input storage loop being negative, out of an output of the RQL flip-flop; and
returning the data input storage loop to the ground state.

11. The method of claim 10, wherein the setting the data input storage loop state comprises triggering a data input Josephson junction in the data input storage loop to establish a current in the data input storage loop, a direction of current circulation in the data input storage loop corresponding to whether the data input SQF pulse is positive or negative.

12. The method of claim 11, wherein the current in the data input storage loop established by the setting the data input storage loop state is insufficient to trigger a second Josephson junction in the data input storage loop that is shared by the data input storage loop, a comparator, and an output amplifying Josephson transmission line (JTL).

13. The method of claim 10,
wherein the data input SFQ pulse is positive; and
wherein the providing the reciprocal SFQ pulse pair to the clock input comprises providing an SFQ clock pulse pair comprising a positive pulse and a negative pulse to the clock input, provided in either order,
one enabled clock SFQ pulse corresponding to the positive pulse to the clock input triggering a logical decision Josephson junction in the data input storage loop, thereby asserting the output, and
another enabled clock SFQ pulse corresponding to the negative pulse to the clock input triggering an escape Josephson junction having a common node with the logical decision Josephson junction, the triggering of the escape Josephson junction not affecting the state of the data input storage loop.

14. The method of claim 13, wherein the triggering of the output Josephson junction:
returns the data input storage loop to the ground state by canceling the current in the data input storage loop; and
cancels a current through the escape Josephson junction created by the providing the enabled clock SFQ pulse corresponding to the positive pulse to the clock input.

15. The method of claim 10,
wherein the data input SFQ pulse is negative; and
wherein the providing the reciprocal SFQ pulse pair to the clock input comprises providing an SFQ clock pulse pair comprising a positive pulse and a negative pulse to the clock input, provided in either order,
one enabled clock SFQ pulse corresponding to the positive pulse to the clock input triggering an escape Josephson junction having a common node with a logical decision Josephson junction in the data input storage loop, the triggering of the escape Josephson junction not affecting the state of the data input storage loop, and
another enabled clock SFQ pulse corresponding to the negative pulse to the clock input triggering the logical decision Josephson junction, thereby de-asserting the output.

16. The method of claim 15, wherein the triggering of the output Josephson junction:
returns the data input storage loop to the ground state by canceling the current in the data input storage loop; and
cancels a current through the escape Josephson junction created by providing the enabled clock SFQ pulse corresponding to the negative pulse to the clock input.

17. The method of claim 10, wherein the providing an enabled clock SFQ pulse corresponding to the logical AND of the enable and clock inputs comprises reversing a DC bias in an enable input loop that includes a Josephson junction in a clock input path, enabling propagation of clock SFQ pulses from the clock input of the RQL flip-flop to the data input storage loop.

18. The method of claim 17, wherein the enable input loop comprises a DC bias loop comprising a Josephson junction, an inductor, and first and second DC bias elements.

19. A reciprocal quantum logic (RQL) phase-mode flip-flop with enable comprising:
- a data signal input to a storage loop, the storage loop comprising:
  - a data input Josephson junction between an input node and a ground node;
  - a storage inductor between the input node and a central node; and
  - a logical decision Josephson junction between the central node and the ground node;
- a logical clock signal input and an enable signal input, both to logical AND circuitry, the logical AND circuitry configured to provide an enabled clock signal to a comparator, the comparator comprising:
  - an enabled clock input inductor and an escape Josephson junction arranged in series between the logical AND circuitry and the central node; and
  - the logical decision Josephson junction.

20. The flip-flop of claim 19, wherein the logical AND circuitry comprises a DC bias loop comprising a Josephson junction, an inductor, and first and second DC bias elements, the DC bias loop being configured to reduce an enable input current corresponding to an SFQ pulse provided to the enable input to about ½ $\Phi_0$.

\* \* \* \* \*